(12) United States Patent  (10) Patent No.: US 7,872,852 B2
Liao et al.  (45) Date of Patent: Jan. 18, 2011

(54) CONDUCTIVE STRUCTURE HAVING CAPACITOR

(75) Inventors: Tsuoe-Hsiang Liao, Hsin-Chu (TW); Huo-Tieh Lu, Taipei (TW); Chih-Chien Liu, Taipei (TW); Hsiang-Hung Peng, Hsinchu County (TW); Yu-Fang Chien, Taipei County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 446 days.

(21) Appl. No.: 12/029,472

(22) Filed: Feb. 12, 2008

(65) Prior Publication Data

US 2009/0201625 A1 Aug. 13, 2009

(51) Int. Cl.
*H01G 4/005* (2006.01)
*H01G 4/06* (2006.01)
(52) U.S. Cl. ..................... 361/303; 361/311

(58) Field of Classification Search ............ 361/303, 361/306.1, 306.2, 311
See application file for complete search history.

(56) References Cited

U.S. PATENT DOCUMENTS

| 5,583,359 | A | 12/1996 | Ng | |
| 6,201,272 | B1* | 3/2001 | Kotecki et al. | 257/296 |
| 6,794,729 | B2* | 9/2004 | Mori et al. | 257/532 |
| 2003/0003665 | A1* | 1/2003 | Nakagawa | 438/275 |
| 2004/0082175 | A1* | 4/2004 | Nakagawa | 438/689 |
| 2005/0047062 | A1* | 3/2005 | Mido et al. | 361/523 |

* cited by examiner

*Primary Examiner*—Eric Thomas
(74) *Attorney, Agent, or Firm*—Winston Hsu; Scott Margo

(57) ABSTRACT

A three-dimensional conductive structure has a first electrode and a second electrode of a capacitor structure, and thereby defines a capacitor space. At least a signal line is further included in the capacitor space where both the first electrode and the second electrode can cross and detour round the signal line. Therefore, the signal line can go directly through the capacitor space for transferring various signals without making a detour to avoid the whole capacitor structure.

15 Claims, 6 Drawing Sheets

CONDUCTIVE STRUCTURE HAVING CAPACITOR

BACKGROUND OF THE INVENTION

1. Field of the Invention

The present invention relates to a capacitor structure, and more particularly, to a capacitor structure with greater flexibility of layout design.

2. Description of the Prior Art

A capacitor structure includes two parallel electrode plates and an insulator disposed between the electrode plates. U.S. Pat. No. 5,583,359 discloses a conventional flat plate capacitor structures. Please refer to FIG. 1, which shows an oblique view of the conductive electrodes of a conventional flat plate capacitor structure 10, with the dielectric layers omitted for clarity. As shown in FIG. 1, the conventional flat plate capacitor structure 10 comprises a first level capacitor pattern (bottom electrode) 16, a second level capacitor pattern 19, a third level capacitor pattern 24, and a fourth level capacitor pattern 28. The first capacitor level capacitor pattern 16 has a main portion 56, a protecting ring 57, and a connecting bar 75; the second capacitor level capacitor pattern 19 has a main portion 60, a protecting ring 61, and a connecting bar 75; the third capacitor level capacitor pattern 24 has a main portion 64, a protecting ring 65, and a connecting bar 75; and the fourth capacitor level capacitor pattern 28 has a main portion 68, a protecting ring 69, and a connecting bar 75.

Sets of conductive vias 70, 72 and 74 are defined between adjacent level capacitor patterns, with separate connecting bars 75 of each conductive layer interconnecting the vias, which connect alternate level capacitor patterns to the same voltage. Accordingly, the main portion 56, the main portion 64, the protecting ring 57, the protecting ring 65, the connecting bar 75 of the second capacitor level capacitor pattern 19, and the interlayer conductive vias 70, 74 form a first electrode of the conventional flat plate capacitor structure 10, while the main portion 60, the main portion 68, the protecting ring 61, the protecting ring 69, the connecting bar 75 of the third capacitor level capacitor pattern 24, and the interlayer conductive vias 72 form a second electrode of the conventional flat plate capacitor structure 10.

Conventional flat plate capacitor structure 10 is configured as a stacked capacitor equivalent to a plurality of capacitors in parallel. The capacitance is determined by the overlap of the main portions of the level capacitor patterns. However, the capacitor dielectric layer, and these main portions of the conventional flat plate capacitor structures 10 is stacked up horizontally, and the overlapping region takes a large layout area for a needed capacitance. Therefore, the layout of the conventional flat plate capacitor structure 10 reduces the density of integration.

SUMMARY OF THE INVENTION

It is therefore one object of the present invention to provide a capacitor structure with greater flexibility of layout design.

From one aspect of the present invention, a conductive structure is disclosed. The conductive structure includes a capacitor structure and at least one signal line. The capacitor structure includes a first electrode and a second electrode so as to define a capacitor space. The first electrode electrically connects to a first voltage, and the second electrode electrically connects to a second voltage. The signal line is disposed in the capacitor space, goes through the capacitor space.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
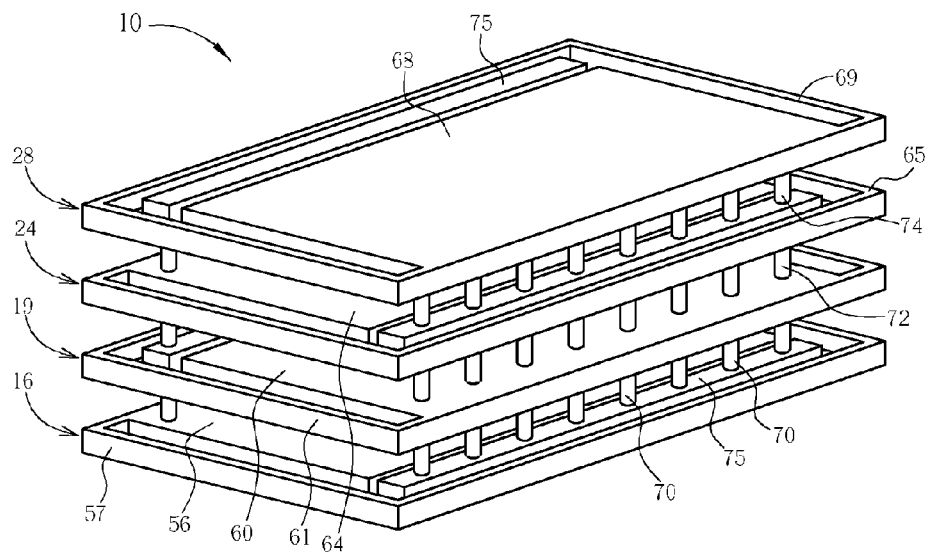
FIG. 1 shows an oblique view of the conductive electrodes of a conventional flat plate capacitor structure.
Figure 2:
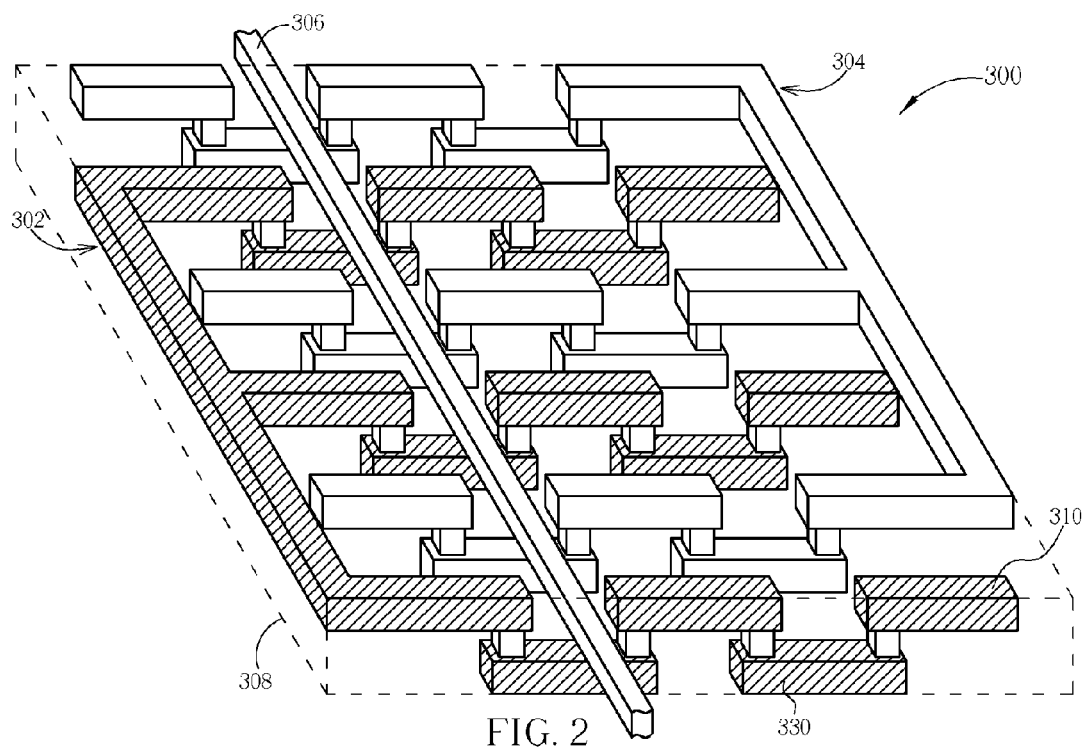
FIG. 2 is an oblique schematic diagram illustrating parts of the conductive structure according to the first preferred embodiment of the present invention.
Figure 3:
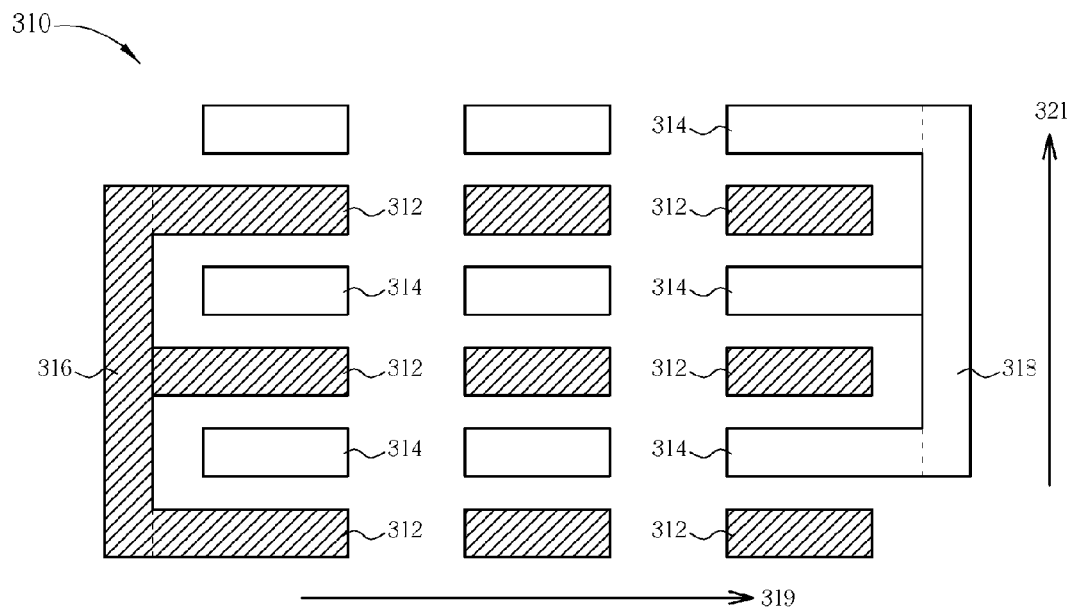
FIG. 3 and FIG. 4 are schematic diagrams illustrating the layouts of the capacitor structure according to the first preferred embodiment of the present invention.
Figure 4:
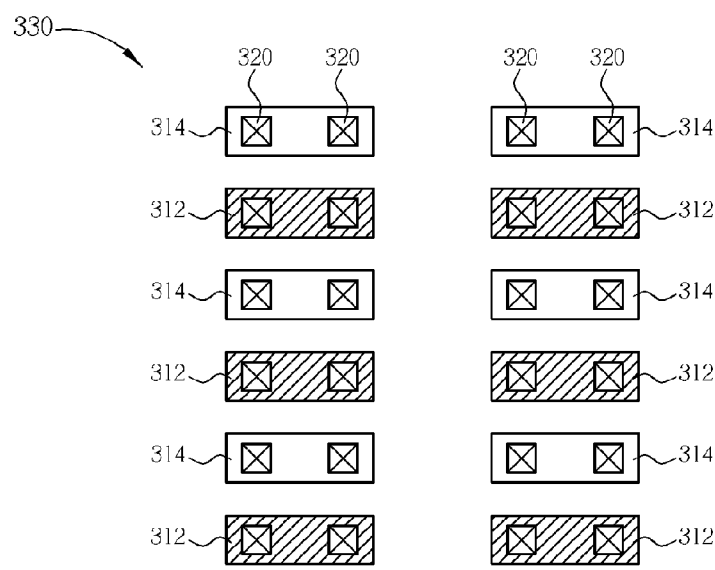
Figure 5:
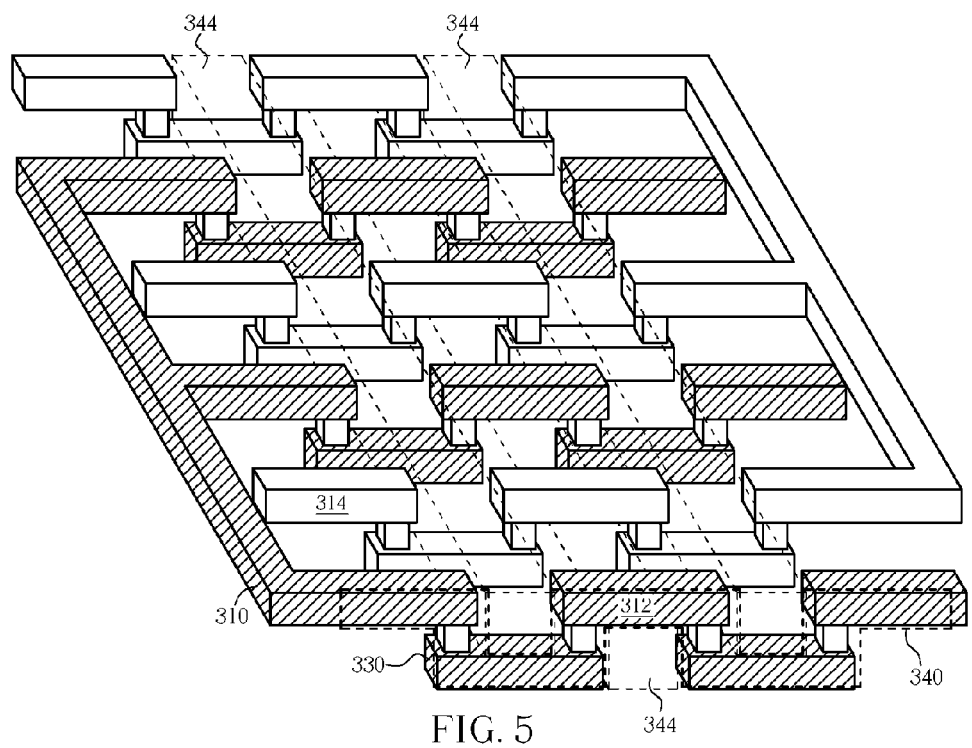
FIG. 5 is an oblique schematic diagram illustrating the continuous gaps of the capacitor structure according to the first preferred embodiment of the present invention.

Please refer to FIG. 2 through FIG. 5. FIG. 2 is an oblique schematic diagram illustrating parts of the conductive structure 300 according to the first preferred embodiment of the present invention; FIG. 3 and FIG. 4 are schematic diagrams illustrating the layouts of the capacitor structure according to the first preferred embodiment of the present invention; and FIG. 5 is an oblique schematic diagram illustrating the continuous gaps of said capacitor structure, where like number numerals designate similar or the same parts, regions or elements. It is to be understood that the drawings are not drawn to scale and serve only for illustration purposes. It is also to be understood that the capacitor dielectric layer of the present invention method is not explicitly shown in the drawings for clarity.

As shown in FIG. 2, the conductive structure 300 is a multiple-layer structure including a capacitor structure and at least one signal line 306, and the capacitor structure includes a first electrode 302 and a second electrode 304. The space, which is occupied by the said first electrode 302 and the said second electrode 304, can define a continuous capacitor space 308. The capacitor space 308 is substantially a cube, and there is only a single capacitor structure included in the capacitor space 308. The first electrode 302 and the second electrode 304 are electrically connected to a first voltage and a second voltage respectively. The signal line 306 is disposed in the capacitor space 308, goes through the capacitor space 308.

As shown in FIG. 3, the capacitor structure includes a first conductive layer 310 disposed in an upper layer. The first conductive layer 310 includes a plurality of first major conductive bars 312, a plurality of second major conductive bars 314, at least one first minor conductive bar 316, and at least one second minor conductive bar 318. However, the signal line 306 is omitted in FIG. 3 for clearly illustrating the layout arrangement of the capacitor structure. Each of the first major conductive bars 312 and each of the second major conductive bars 314 are parallel to a first direction 319, and the first major conductive bars 312 and the second major conductive bars 314 are alternatively arranged along a second direction 321, where the first direction 319, the second direction 321 and the normal of the first conductive electricity layer 310 are perpendicular to each other, but not limited to those directions. The first minor conductive bar 316 can be perpendicular to each first major conductive bar 312. The first major conductive bars 312 can be electrically connected to each other through the first minor conductive bar 316, and are electrically connected to the first voltage. Similarly, the second minor conductive bar 318 can be perpendicular to each second major conductive bar 314. The second major conductive bars 314 can also be electrically connected to each other through the second minor conductive bar 318, and to the second voltage.

As shown in FIG. 4, the capacitor structure further includes a second conductive layer 330, and parts of the first conductive layer 310 can be electrically connected to parts of the second conductive layer 330 through a plurality of conductive plugs 320. The second conductive layer 330 includes a plurality of first major conductive bars 312 and a plurality of second major conductive bars 314. A signal line can also be included in the second conductive layer 330 in other embodiments.

In this embodiment, the first major conductive bars 312 and the second major conductive bars 314 disposed in the first conductive layer 310 have a similar layout pattern with the first major conductive bars 312 and the second major conductive bars 314 disposed in the second conductive layer 330. A difference is that the second conductive layer 330 and the first conductive layer 310 are placed at an offset. In other words, the position of the second conductive layer 330 is offset from the position of the first conductive layer 310 along the first direction 319, so that one first major conductive bar 312 of the second conductive layer 330 can be positioned right under two first major conductive bars 312 of the first conductive layer 310, and the first major conductive bar 312 of the second conductive layer 330 can be electrically connected to the two first major conductive bars 312 of the first conductive layer 310 by the conductive plugs 320. At the same time, one first major conductive bar 312 of the first conductive layer 310 can be positioned right above two first major conductive bars 312 of the second conductive layer 330, and they can be electrically connected through the conductive plugs 320 between them.

As shown in FIG. 5, the first major conductive bars 312 of the first conductive layer 310 and the first major conductive bars 312 of the second conductive layer 330 are connected to form at least one tooth structure 340 by the conductive plugs 320. The second major conductive bars 314 of the first conductive layer 310 and the second major conductive bars 314 of the second conductive layer 330 are also connected to form at least another tooth structure (not shown in the drawings) by the conductive plugs 320. The crenels of the tooth structure can form a plurality of continuous gaps 344 having no electrode therein. In other words, the continuous gaps 344 include spaces confined between the adjacent first major conductive bars 312 and spaces confined between the adjacent second major conductive bars 314, and the continuous gap 344 does not include the first major conductive bars 312 and the second major conductive bars 314. Every continuous gap 344 can go through the capacitor space 308, and holds the signal line 306 of the integrated circuit in practice for transmission of signals. For instance, with reference to both FIG. 2 and FIG. 5, the signal line 306 can be disposed in the continuous gap 344, be arranged along the direction of the continuous gap 344, go through both ends of the continuous gap 344.

Accordingly, the first electrode 302 or the second electrode 304 of the present invention can cross and detour round the signal line 306. Therefore, the signal line can 306 go directly through the capacitor space 308 for transferring various signals without making a detour to avoid the huge capacitor structure. It not only can effectively increase the speed of transferring signals, but also improves the flexibility of layout design and the possibility of arrangements. In addition, since the capacitor electrodes of the present invention are formed by series connections of conductive bars and conductive plugs, and the capacitor electrodes of the conventional flat plate capacitor structure are formed by large flat plates, the present invention can also reduce the structural stress of the integrated circuit having capacitor structures.

Figure 6:
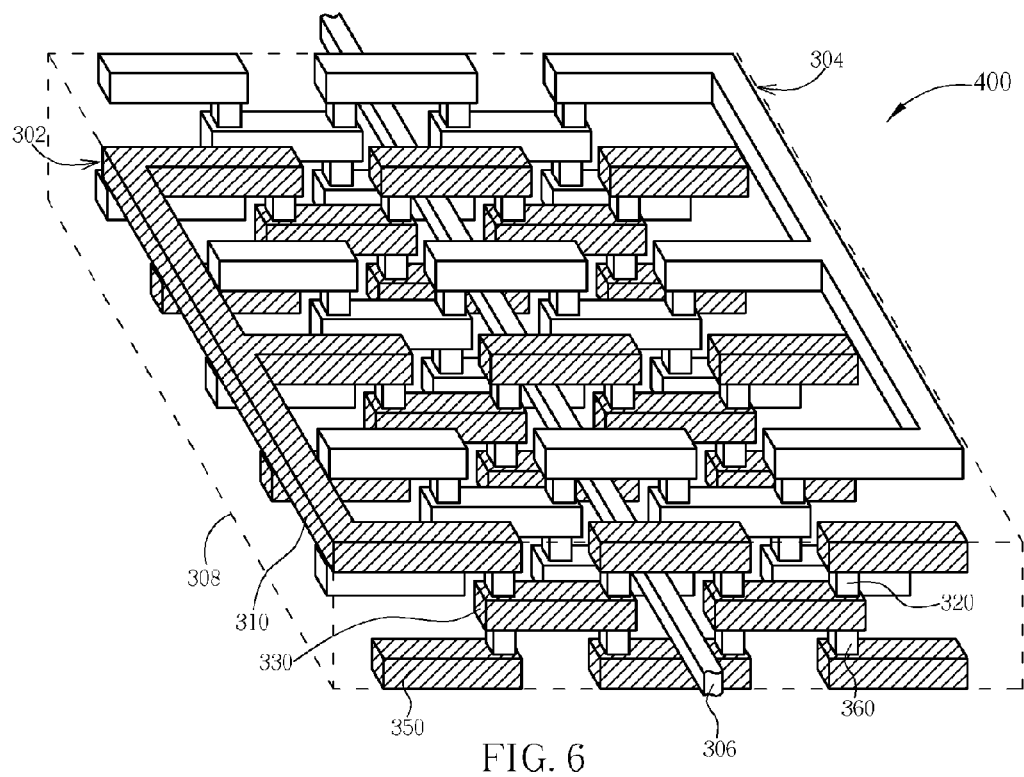
FIG. 6 is an oblique schematic diagram illustrating parts of the conductive structure according to the second preferred embodiment of the present invention.
Figure 7:
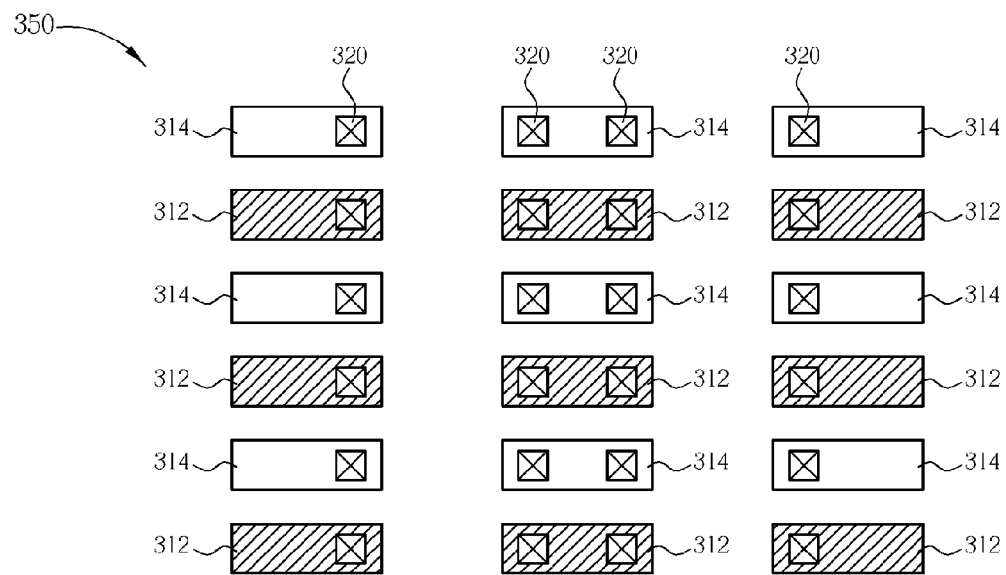
FIG. 7 is a schematic diagram illustrating the layout of the third conductive layer of the capacitor structure according to the second preferred embodiment of the present invention.
Figure 8:
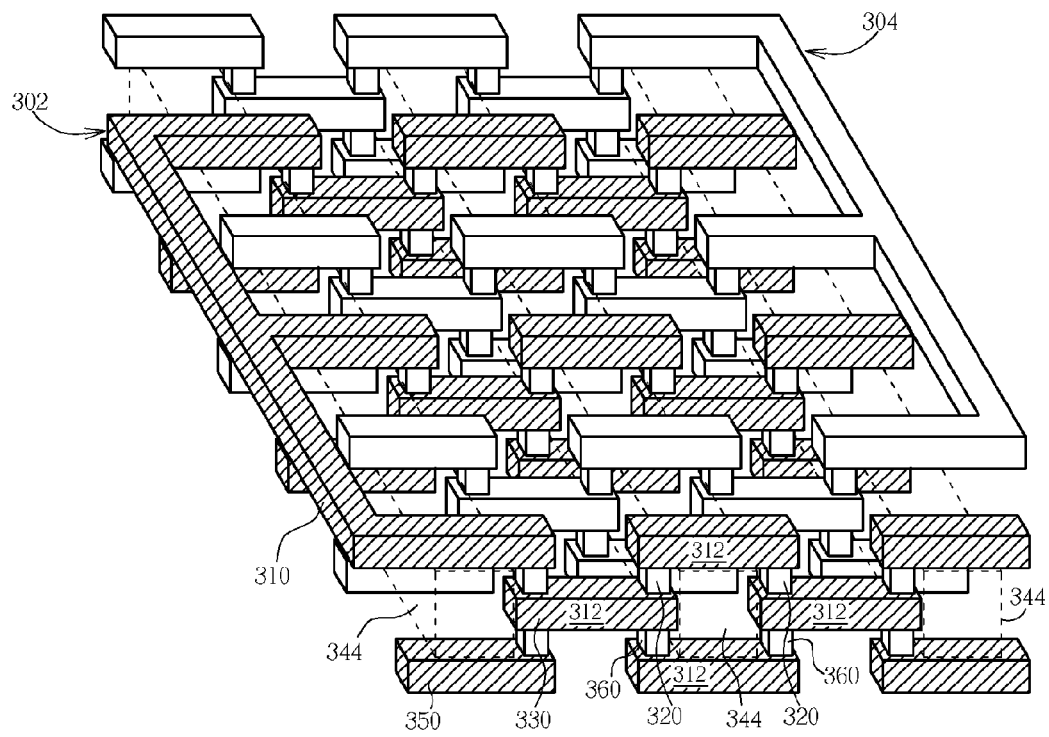
FIG. 8 is an oblique schematic diagram illustrating the continuous gaps of the capacitor structure according to the second preferred embodiment of the present invention.

Please refer to FIG. 6 through FIG. 8. FIG. 6 is an oblique schematic diagram illustrating the conductive structure 400 according to the second preferred embodiment of the present invention; FIG. 7 is a schematic diagram illustrating the layout of the third conductive layer 350 according to the second preferred embodiment; and FIG. 8 is an oblique schematic diagram illustrating the continuous gaps according to the second preferred embodiment of the present invention. The embodiment follows the above-mentioned example of the three-dimensional capacitor structure, which has three conductive layers and two plug layers. As shown in FIG. 6, the main difference between the conductive structure 300 and the conductive structure 400 is that the conductive structure 400 further includes a third conductive layer 350.

As shown in FIG. 7, the first major conductive bars 312 and the second major conductive bars 314 disposed in the third conductive layer 350 have a similar layout pattern with the first major conductive bars 312 and the second major conductive bars 314 disposed in the first conductive layer 310, and can be correspondingly positioned right under the first conductive layer 310. As shown in FIG. 8, the continuous gap 344 can include spaces confined in between the adjacent first major conductive bars 312 and spaces confined in between the adjacent second major conductive bars 314. It is one characteristic of the present invention that the capacitor electrodes of the present invention can cross and detour round other elements or devices of the integrated circuit, so that capacitor and other elements of the integrated circuit can exist in one capacitor space 308 simultaneously. Thus, the above-mentioned conductive bars can have other shapes, such as a conductive cube.

Figure 9:
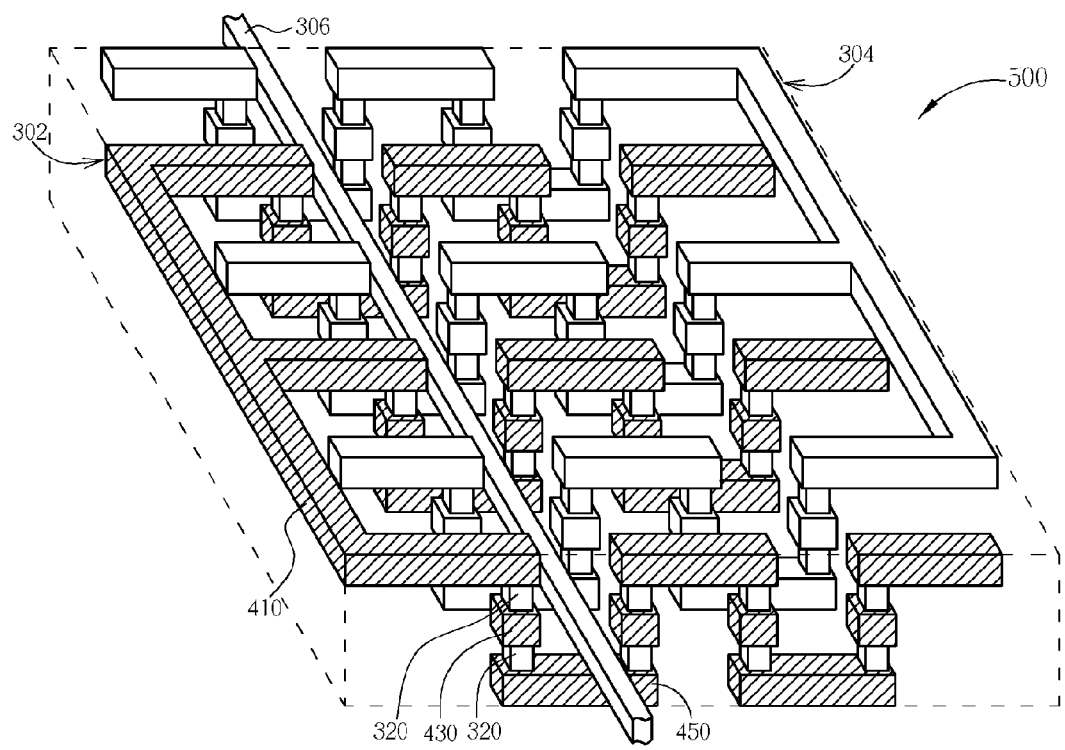
FIG. 9 is a schematic diagram illustrating the layout of the fourth conductive layer of the capacitor structure according to the third preferred embodiment of the present invention.
Figure 10:
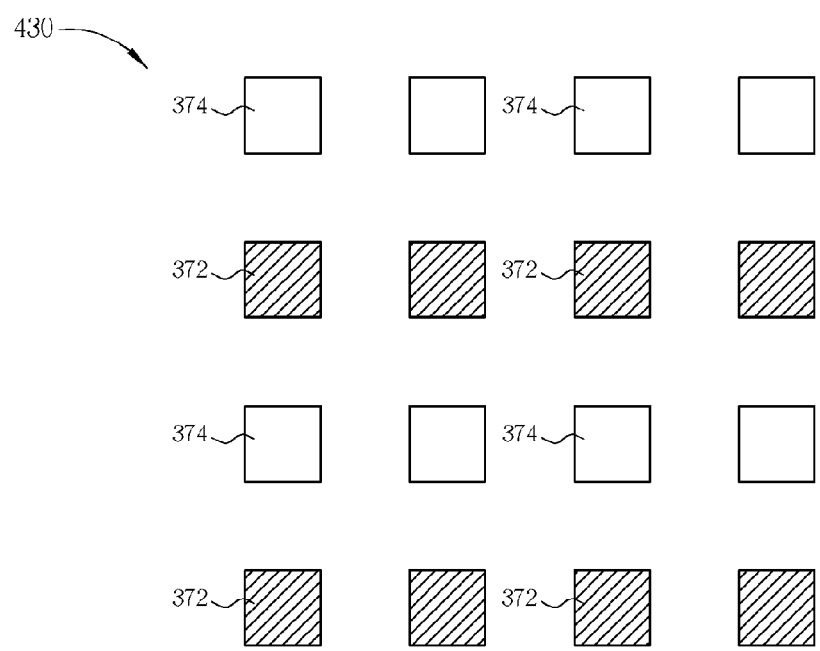
FIG. 10 is a schematic diagram illustrating the layout of the fourth conductive layer of the capacitor structure according to the third preferred embodiment of the present invention
Figure 11:
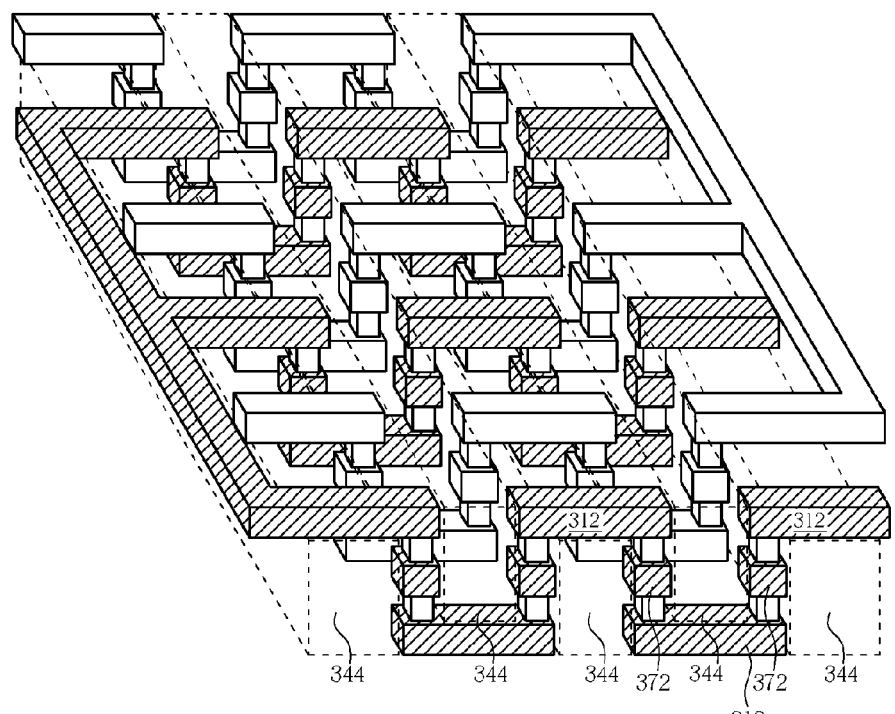
FIG. 11 is an oblique schematic diagram illustrating the continuous gaps of the capacitor structure according to the third preferred embodiment of the present invention.

Please refer to FIG. 9 through FIG. 11. FIG. 9 is an oblique schematic diagram illustrating the conductive structure 500 according to the third preferred embodiment of the present invention; FIG. 10 is a schematic diagram illustrating the layout of the fourth conductive layer 430 of the capacitor structure according to the third preferred embodiment; and FIG. 11 is an oblique schematic diagram illustrating the continuous gaps according to the third preferred embodiment. As shown in FIG. 9, the conductive structure 500 includes a first conductive layer 410, a second conductive layer 430 and a third conductive layer 450 from top to bottom. The layout pattern of the first conductive layer 410 and the layout pattern of the third conductive layer 450 can be the same as the layout pattern of the first conductive layer 310 and the layout pattern of the second conductive layer 330 in the first embodiment respectively.

As shown in FIG. 9 and FIG. 10, the fourth conductive layer 430 of this embodiment further includes a plurality of first conductive islands 372 and a plurality of second conductive islands 374. The first conductive islands 372 and the second conductive islands 374 are correspondingly disposed under the first major conductive bars 312 and the second conductive bars 314 respectively. As shown in FIG. 11, the continuous gap 344 can include spaces confined in between the adjacent first major conductive bars 312, spaces confined in between the adjacent first conductive islands 372, spaces confined in between the adjacent second major conductive bars 314, and spaces confined in between the adjacent second conductive islands 374.

Figure 12:
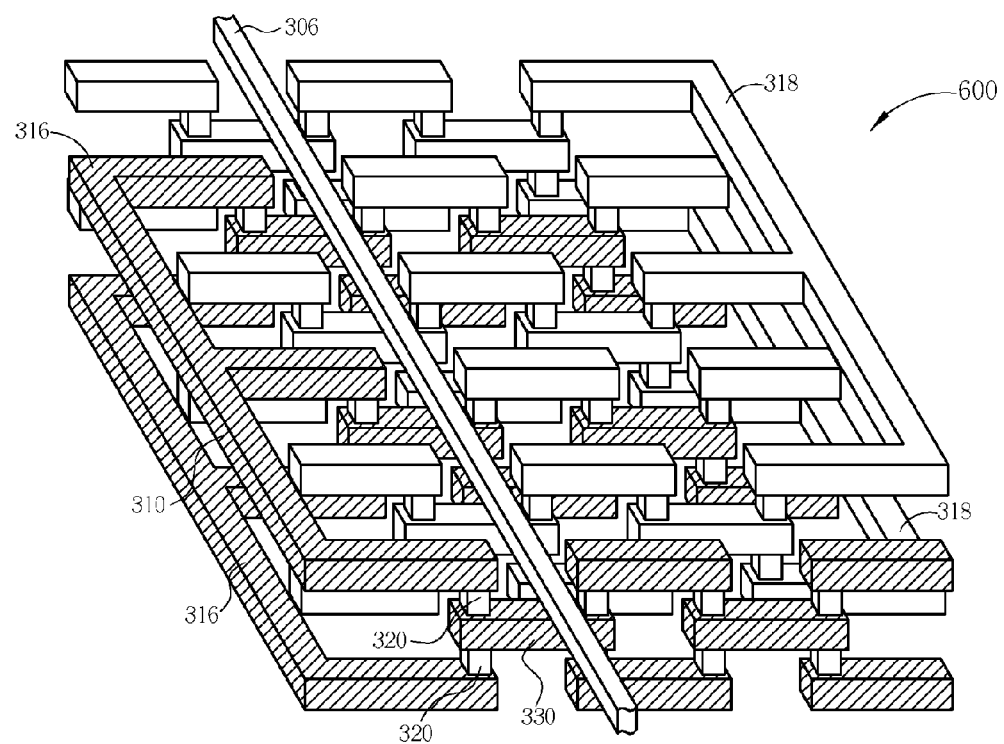
FIG. 12 is an oblique schematic diagram illustrating parts of the conductive structure according to the fourth preferred embodiment of the present invention.

In addition, more conductive bars or conductive islands can be included in the present invention around, above or under the conductive structure to increase the capacitance, or to improve the stability of the conductive structure. Please refer to FIG. 12, which is an oblique schematic diagram illustrating parts of the conductive structure 600 according to the fourth preferred embodiment of the present invention. As shown in FIG. 12, the main difference between the third and the fourth embodiment is that the conductive structure 600 includes a plurality of first minor conductive bars 316 and a plurality of second minor conductive bars 318.

In sum, the capacitor structure of the present invention can have a high capacitance, effectively reducing the structural stress of the integrated circuit, and increasing the flexibility of layout design and the possibility of arrangements in the meantime.

Those skilled in the art will readily observe that numerous modifications and alterations of the device and method may be made while retaining the teachings of the invention.

What is claimed is:

1. A conductive structure, comprising:
a capacitor structure, the capacitor structure comprising a first electrode and a second electrode so as to define a capacitor space, the first electrode electrically connecting to a first voltage, the second electrode electrically connecting to a second voltage; and
at least one signal line disposed in the capacitor space, the signal line going through the capacitor space;
wherein the first electrode comprises a plurality of first major conductive bars and a plurality of first plugs, all the major conductive bars and the first plugs electrically connect to the first voltage, and the signal line goes through a space confined between the first major conductive bars.

2. The conductive structure of claim 1, wherein the capacitor space is a cube, and only a single capacitor structure is disposed in the capacitor space.

3. The conductive structure of claim 1, wherein the second electrode comprise a plurality of second major conductive bars and a plurality of second plugs, all the second major conductive bars and the second plugs electrically connect to the second voltage, and the signal line goes through a space confined between the second major conductive bars.

4. The conductive structure of claim 3, wherein the capacitor structure comprises at least one continuous gap, and the continuous gap comprises spaces confined between the adjacent first major conductive bars and spaces confined between the adjacent second major conductive bars.

5. The conductive structure of claim 4, wherein the conductive structure comprises a multiple-layer structure, and the multiple-layer structure comprises at least one upper layer and at least one lower layer.

6. The conductive structure of claim 5, wherein at least two of the first major conductive bars are disposed in the upper layer, and at least one of the first major conductive bars is disposed in the lower layer, the two first major conductive bars disposed in the upper layer are positioned at two opposite sides of the continuous gap respectively, and the first major conductive bars disposed in the lower layer are positioned right under the two first major conductive bars disposed in the upper layer and the continuous gap.

7. The conductive structure of claim 5, wherein each of the first major conductive bars and each of the second major conductive bars are parallel with a first direction, and the major conductive bars and the second major conductive bars are alternately arranged along a second direction.

8. The conductive structure of claim 7, wherein the first major conductive bars disposed in the upper layer are staggered to the first major conductive bars disposed in the lower layer.

9. The conductive structure of claim 4, wherein the conductive structure comprises a multiple-layer structure, and the multiple-layer structure comprises at least one upper layer, at least one middle layer and at least one lower layer.

10. The conductive structure of claim 9, wherein at least one of the first major conductive bars is disposed in the upper layer, at least two of the first major conductive bars are disposed in the middle layer, and at least one of the first major conductive bars is disposed in the lower layer.

11. The conductive structure of claim 10, wherein the two first major conductive bars disposed in the middle layer are positioned at two opposite sides of the continuous gap respectively, and the first major conductive bars disposed in the lower layer and the first major conductive bars disposed in the upper layer are positioned right under and above the continuous gap respectively.

12. The conductive structure of claim 9, wherein the first electrode further comprises a plurality of first conductive islands, and all the conductive islands electrically connect to the first voltage.

13. The conductive structure of claim 12, wherein at least two of the first major conductive bars are disposed in the upper layer, at least two of the first conductive islands are disposed in the middle layer, and at least one of the first major conductive bars is disposed in the lower layer.

14. The conductive structure of claim 13, wherein the two first major conductive bars disposed in the upper layer are positioned at two opposite sides of the continuous gap respectively, the two first conductive islands disposed in the middle layer are also positioned at two opposite sides of the continuous gap respectively, and the first major conductive bars disposed in the lower layer are positioned right under the two first conductive islands disposed in the middle layer and the continuous gap.

15. The conductive structure of claim 4, wherein the first electrode further comprises at least one first minor conductive bar, the first minor conductive bar is perpendicular to the first major conductive bars, and the first major conductive bars electrically connect to each other through the first minor conductive bar.

* * * * *